(12) United States Patent
Jürgensen et al.

(10) Patent No.: US 6,973,143 B2
(45) Date of Patent: Dec. 6, 2005

(54) SOFT-NORMALIZER FOR A CHANNEL DECODER

(75) Inventors: Jens-Uwe Jürgensen, Fellbach (DE); Richard Stirling-Gallacher, Stuttgart (DE); Zhaocheng Wang, Stuttgart (DE); Taku Nagase, Kanagawa (JP)

(73) Assignee: Sony International (Europe) GmbH, Berlin (DE)

( * ) Notice: Subject to any disclaimer, the term of this patent is extended or adjusted under 35 U.S.C. 154(b) by 784 days.

(21) Appl. No.: 09/940,375

(22) Filed: Aug. 27, 2001

(65) Prior Publication Data

US 2002/0025008 A1   Feb. 28, 2002

(30) Foreign Application Priority Data

Aug. 28, 2000   (EP) ................................. 00118619

(51) Int. Cl.[7] ............................ H03D 1/00; H04L 27/06
(52) U.S. Cl. ...................... 375/340; 375/243; 375/245; 375/341; 341/51
(58) Field of Search .................... 375/240.03, 243, 375/245, 237–239, 265, 320, 341, 353, 340; 327/58, 60, 62, 306, 309, 310; 329/321, 312–314, 329/350; 340/511; 341/51, 139, 140, 200; 704/222, 224, 225, 230, 234, 242; 714/760, 714/795, 794; 455/142, 226.3

(56) References Cited

U.S. PATENT DOCUMENTS 5,079,547 A * 1/1992 Fuchigama et al. ........... 341/51

6,047,035 A   4/2000 Yellin
6,081,565 A   6/2000 Marandi et al.

OTHER PUBLICATIONS

Lee Y K et al: "Normalization, Windowing and Quantization of Soft-Decision Viterbi Decoder Inputs in CDMA Systems" Houston, TX, May 16-20, 1999, New York, NY: IEEE, US, vol. CONF. 49, May 16, 1999, pp. 221-225, XP000899229.
Blazek Z et al: "A DSP-Based Implementation of a Turbo Decoder" Sydney, Nov. 8-12, 1998, New York, NY: IEEE, US, 1998, pp. 2751-2755, XP000801545.

* cited by examiner

Primary Examiner—Young T. Tse
Assistant Examiner—Edith Chang
(74) Attorney, Agent, or Firm—Frommer Lawrence & Haug LLP; William S. Frommer; Samuel S. Lee

(57) ABSTRACT

The invention proposes a device for generating, from incoming signal values ($X_{i,n}$), soft-values ($Y_{i,n}$) to be input into a channel decoder of a communication device for use in a wireless communication system, comprising truncation means (24, 26, 28) for truncating the incoming signal values ($X_{i,n}$) such as to fall within a predetermined limit value range, and normalization means (30, 32) for normalizing the truncated signal values ($X'_{i,n}$) such as to fit to an input range of the decoder. According to the invention, the truncation means (24, 26, 28) are adapted to determine the boundaries of the limit value range in dependence on information representative of a signal-to-noise ratio of the incoming signal values ($X_{i,n}$). The truncated signal values ($X'_{i,n}$), after normalization, then are output as said soft-values ($Y_{i,n}$).

2 Claims, 2 Drawing Sheets

SOFT-NORMALIZER FOR A CHANNEL DECODER

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND

1. Field of the Invention

The present invention relates to a device for generating, from incoming signal values, soft-values to be input into a channel decoder of a communication device for use in a wireless communication system, comprising:

truncation means for truncating the incoming signal values such as to fall within a predetermined limit value range, and normalization means for normalizing the truncated signal values such as to fit to an input range of the decoder.

2. Description of Related Art

In the field of channel decoding in wireless communication systems (e.g. GSM or UMTS systems) it is conventionally known to provide a channel decoder with information on the reliability of its input values which then are decoded according to a so called soft-decision decoding scheme using the reliability information. One example of a soft-decision decoding scheme is an iterative decoding scheme called Turbo decoding. After demodulation, signal values received by a communication device (e.g. a base station or a mobile terminal) of the communication system are converted into so called soft-values which contain the above-mentioned reliability information and are fed into the decoder.

FIG. 4 shows a block diagram of a decoding section of a communication device for a wireless communication system according to a known solution. The decoding section comprises a soft-value generation device 10 of the kind specified above and a channel decoder 12. The soft-value generation device 10 comprises a normaliser 14 and an ensuing soft-demodulator 16. Incoming signal values $X_{i,n}$ (i representing the frame number and n representing the value number within frame i) are normalised by the normaliser 14 so that the range of output values $Y'_{i,n}$ of the normaliser 14 fits to the input range (e.g. 8 bit) of the decoder 12. The output values $Y'_{i,n}$ of the normaliser 14 are fed into the soft-demodulator 16 which produces log-likelihood soft-values $Y_{i,n}$ needed for the decoder 12. Soft-demodulation means that the normalised values $Y'_{i,n}$ are multiplied by a value which is related to the signal-to-noise ratio SNR of the communication channel used. After being soft-demodulated, the values $Y_{i,n}$ have to be limited by a limiter provided within the soft-demodulator 16 so that their range fits to the input range of the decoder 12.

In the normaliser 14, the incoming values $X_{i,n}$, before being normalised, are truncated meaning that all the values which are above a predetermined maximum value are replaced by the maximum value and all the values which are below a predetermined minimum value are replaced by the minimum value. An absolute mean value calculated from the values of the $X_{i,n}$ values and multiplied by a fixed scaling factor is used as the absolute value of the maximum and minimum values.

The above-described known soft-value generation device involves a considerable hardware complexitiy due to the provision of the normaliser, soft-demodulator and limiter. It is therefore an object of the present invention to provide a soft-value generation device which requires a less complex hardware.

SUMMARY

To achieve this object the present invention provides a device for generating, from incoming signal values, soft-values to be input into a channel decoder of a communication device for use in a wireless communication system, comprising:

truncation means for truncating the incoming signal values such as to fall within a predetermined limit value range, and normalization means for normalizing the truncated signal values such as to fit to an input range of the decoder, characterized in that the truncation means are adapted to determine the boundaries of the limit value range in dependence on information representative of a signal-to-noise ratio of the incoming signal values, and in that the truncated signal values, after normalization, are output as the soft-values.

In the inventive solution, the boundaries of the limit value range are not kept fixed as is the case in the prior art device but they depend on the signal-to-noise characteristic of the communication channel that was used for transmission of the incoming signal. By truncating the signal values along boundaries which are determined in dependence of the signal-to-noise characteristic and by subsequently normalising the signal values thus truncated, the normalised values can be given the reliability information which is needed by the decoder for properly decoding them. A separate soft-demodulation process and an ensuing limiting process as in the prior art device are not needed. Thus, the three functional blocks normalisation, soft-demodulation and limitation of the prior art device can be replaced in the inventive device by a single functional block which is referred to hereinafter as a soft-normaliser. When implementing the soft-normaliser, the hardware can be considerably less complex than in the prior art device. Furthermore, it has been shown that using the soft-values generated by the inventive soft-normaliser as input values for a turbo decoder, the number of iterations the turbo decoder needs to produce decoded values can be reduced.

According to a preferred embodiment, the truncation means may be adapted to calculate, from the incoming signal values, an absolute mean value and to determine the boundaries of the limit value range based on the absolute mean value multiplied by a scaling factor. Then, in order to provide for the dependency of the boundaries of the limit value range on the signal-to-noise ratio, the truncation means may be adapted to determine the scaling factor dependent on the information representative of the signal-to-noise ratio.

Preferably, the truncation means may be adapted to determine the scaling factor such as to obtain a greater limit value range when the signal-to-noise ratio is low and to obtain a smaller limit value range when the signal-to-noise ratio is high. In other words, a broader limit value range is used when the reliability of the incoming signal values is low, and a smaller limit value range is used when the reliability of the incoming signal values is high.

The present invention also provides a method for generating, from incoming signal values, soft-values to be input into a channel decoder of a communication device for use in a wireless communication system, comprising the steps of:
- truncating the incoming signal values such as to fall within a predetermined limit value range, and
- normalizing the truncated signal values such as to fit to an input range of the decoder, characterized by the step of determining the boundaries of the limit value range in dependence on information representative of a signal-to-noise ratio of the incoming signal values, and outputting the truncated signal values, after normalization, as the soft-values.

In this method, an absolute mean value may be calculated from the incoming signal values, and the boundaries of the limit value range then may be determined based on the absolute mean value multiplied by a scaling factor, the scaling factor being determined dependent on the information representative of the signal-to-noise ratio. Particularly, the scaling factor may be determined such as to obtain a greater limit value range when the signal-to-noise ratio is low and to obtain a smaller limit value range when the signal-to-noise ratio is high.

BRIEF DESCRIPTION OF THE DRAWING

In the following, the invention is described, by way of example only, in greater detail in relation to the accompanying drawings, in which.

DETAILED DESCRIPTION

Figure 1:
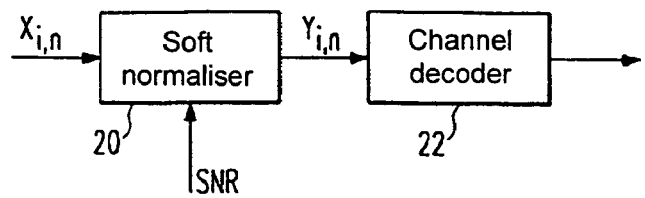
FIG. 1 shows a block diagram of a decoding section of a communication device for a wireless communication system according to the present invention.

The decoding section shown in FIG. 1 is part of a communication device, e.g. a base station or a mobile terminal, of a wireless communication system, e.g. the GSM or UMTS system. The decoding section comprises a soft-value generation device—or soft-normaliser—20 and a channel decoder 22. The soft-normaliser 20 receives signal values $X_{i,n}$ (i representing the frame number and n representing the value number within frame i) from a QPSK or any other demodulator not shown herein. The channel decoder 22 which is preferably an iterative decoder, e.g. a Turbo decoder, needs log-likelihood soft-values $Y_{i,n}$ as its input. The soft-normaliser 20 generates such log-likelihood soft-values $Y_{i,n}$ from the incoming signal values $X_{i,n}$.

Figure 2:
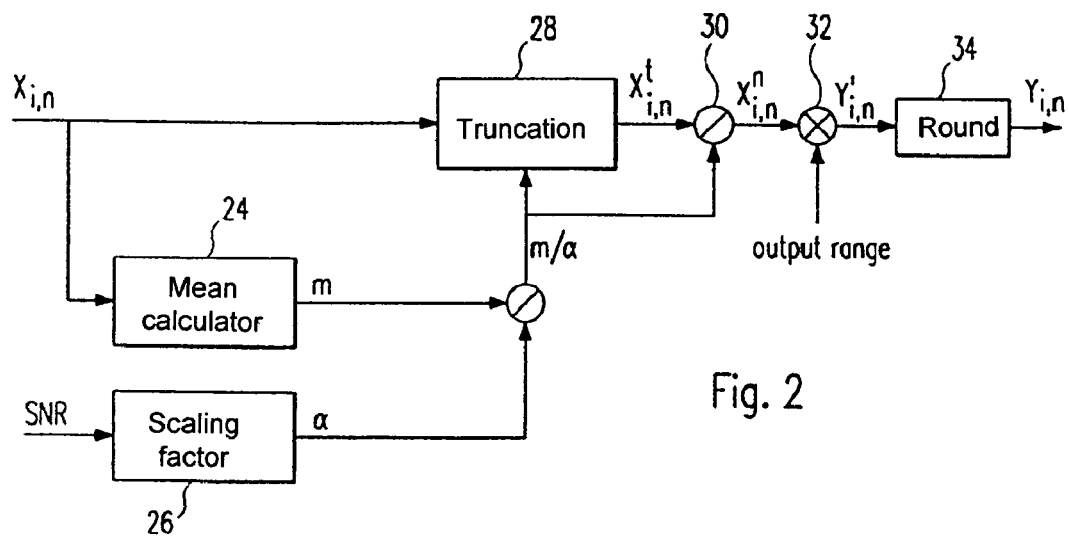
FIG. 2 shows a block diagram of a soft-normaliser of the decoding section of FIG. 1, FIG. 3 schematically shows a signal diagram for explaining the operation of the soft-normaliser of FIG. 2.

FIG. 2 shows the structure of the soft-normaliser 20. The soft-normaliser 20 comprises a mean calculation block 24 for calculating an absolute mean value m of the incoming signal values $X_{i,n}$, a scaling factor generation block 26 for generating a scaling factor $\alpha$, and a truncation block 28 for truncating the signal values $X_{i,n}$. The truncation depends on the absolute mean value m and on the scaling factor $\alpha$.

The calculation of the absolute mean value m is based on the absolute values of $X_{i,n}$ and can be done over one frame or a plurality of frames. The scaling factor $\alpha$ is related to the signal-to-noise ratio SNR of $X_{i,n}$. The relationship between the scaling factor $\alpha$ and the signal-to-noise ratio SNR can be given by a formula or a look-up table prestored in the scaling factor generation block 26. The relationship between $\alpha$ and the signal-to-noise ratio is such that $\alpha$ increases as the signal-to-noise ratio increases, i.e. as the transmission quality of the transmission channel gets higher.

In the truncation block 28, the signal values $X_{i,n}$ are truncated so as to fall within a limit value range whose boundaries depend on the absolute mean value m and on the scaling factor $\alpha$. This means that all $X_{i,n}$ which are above the upper boundary of the limit value range are replaced by the value of the upper boundary and all $X_{i,n}$ which are below the lower boundary of the limit value range are replaced by the value of the lower boundary. The remaining $X_{i,n}$ pass unchanged through the truncation block 28. Specifically, the upper boundary of the limit value range is set to $m/\alpha$ and the lower boundary is set to $-m/\alpha$. In this way, when the incoming signal values $X_{i,n}$ are slightly disturbed by noise (high value of $\alpha$) and thus can be considered as having a good reliability the limit value range is set narrow, and when the incoming signal values $X_{i,n}$ are heavily disturbed by noise (low value of $\alpha$) and thus can be considered as having a poor reliability the limit value range is set broad.

The truncated signal values as output from the truncation block 28 are designated $X^t_{i,n}$ in FIG. 2. A normalisation process is then performed on the truncated signal values $X^t_{i,n}$. To this end, the truncated signal values $X^t_{i,n}$ are divided at a division point 30 by the maximum possible value which can be assumed by the truncated signal values $X^t_{i,n}$, i.e. they are divided by $m/\alpha$. Subsequently, the normalised values which are designated $X^n_{i,n}$ in FIG. 2 are adapted in range by a multiplier 32 so as to make the output range of the soft-values which are output from the soft-normaliser 20 match the input range of the decoder 22 (see position 32 in FIG. 2). The output soft-values are designated $Y_{i,n}$ in FIG. 2. The soft-values $Y'_{i,n}$ output from the multiplier 32 are supplied to a rounding means 34 for rounding the soft-values $Y_{i,n}$ output from the soft-normaliser 20 to the required input bit range of the decoder 22. The output range of the soft-normaliser 20 is related to the number of bits which are fed to the decoder 22.

Figure 3:
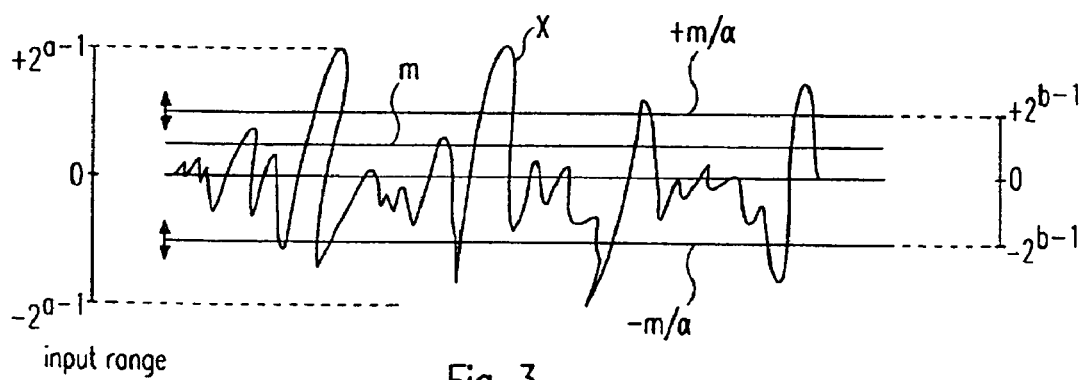
Figure 4:
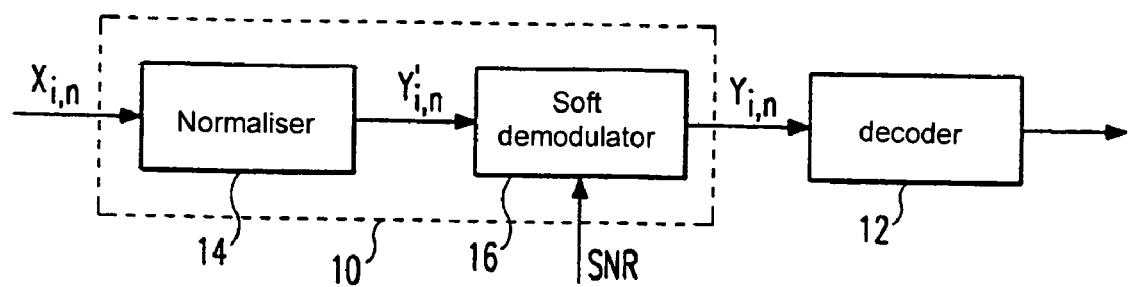
FIG. 4 shows a block diagram of a decoding section according to the prior art.

FIG. 3 illustrates the above operations. The incoming signal values $X_{i,n}$ are represented in FIG. 3 by a signal X the range of which lies between values $+2^{a-1}$ and $-2^{a-1}$, where a represents the number of bits used for the soft-normaliser input. Also indicated in FIG. 3 are the absolute mean m of X as well as the boundaries of the limit value range, i.e. $+m/\alpha$ and $-m/\alpha$, above and below which the signal X is truncated. By the subsequent normalisation process the truncated signal X is mapped to a range from $-2^{b-1}$ to $+2^{b-1}$, where b represents the number of bits used for the soft-normaliser output. The normalised signal is then rounded and output from the soft-normaliser 20 with a number of bits b which fits to the input range of the decoder 22.

We claim:

1. A device for generating, from incoming signal values ($X_{i,n}$), soft-values ($Y_{i,n}$) to be input into a channel decoder (22) of a communication device for use in a wireless communication system, comprising:
    truncation means (24, 26, 28) for truncating said incoming signal values ($X_{i,n}$) to fall within a predetermined limit value range to generate truncated signal values ($X^t_{i,n}$); and
    normalization means (30, 32) for normalizing said truncated signal values ($X^t_{i,n}$) to fit to an input range of said channel decoder (22), wherein said truncation means (24, 26, 28) are adapted to determine the boundaries of said predetermined limit value range in dependence on information representative of a signal-to-noise ratio of said incoming signal values ($X_{i,n}$), and in that said truncated signal values ($X^t_{i,n}$) after normalization, are output as said soft-values ($Y_{i,n}$), and wherein said truncation means (24, 26, 28) are adapted to calculate, from said incoming signal values ($X_{i,n}$), an absolute mean value (m) and to determine said boundaries of said predetermined limit value range based on said absolute mean value (m) multiplied by a scaling factor ($1/\alpha$), said truncation means (24, 26, 28) being adapted to determine said scaling factor dependent on said information representative of said signal-to-noise ratio.

2. A method for generating, from incoming signal values ($X_{i,n}$), soft-values ($Y_{i,n}$) to be input into a channel decoder (22) of a communication device for use in a wireless communication system, comprising the steps of:

truncating said incoming signal values ($X_{i,n}$) to fall within a predetermined limit value range to generate truncated signal values ($X^t_{i,n}$);

normalizing said truncated signal values ($X^t_{i,n}$) fit to an input range of said channel decoder (22);

determining the boundaries of said predetermined limit value range in dependence on information representative of a signal-to-noise ratio of said incoming signal values ($X_{i,n}$), and outputting said truncated signal values ($X^t_{i,n}$) after said normalizing, as said soft-values ($Y_{i,n}$); and calculating, from said incoming signal values ($X_{i,n}$), an absolute mean value (m) and determining said boundaries of said predetermined limit value range based on said absolute mean value (m) multiplied by a scaling factor ($1/\alpha$), said scaling factor being determined dependent on said information representative of said signal-to-noise ratio.

* * * * *